United States Patent

[11] 3,601,630

[72] Inventor Donald J. Redwine
Houston, Tex.
[21] Appl. No. 836,811
[22] Filed June 26, 1969
[45] Patented Aug. 24, 1971
[73] Assignee Texas Instruments Incorporated
Dallas, Tex.

[54] MOS CIRCUIT WITH BIPOLAR EMITTER-FOLLOWER OUTPUT
6 Claims, 2 Drawing Figs.

[52] U.S. Cl. .......... 307/205, 307/213, 307/303, 307/304, 330/18, 330/32, 330/35, 330/38 M
[51] Int. Cl. .......... H03k 19/08
[50] Field of Search .......... 330/15, 18, 32, 35, 38; 307/205, 213, 303, 304; 317/235, 22.2

[56] References Cited

OTHER REFERENCES

Ahrons et al., " Hybrid Bi-Polar and Mos Digital Circuits" RCA Technical Notes RCA TN No. 684 June 1966, 2 sheets 307- 304

*Primary Examiner*—Roy Lake
*Assistant Examiner*—James B. Mullins
*Attorneys*—James O. Dixon, Andrew M. Hassell, Harold Levine, Melvin Sharp, John E. Vandigriff, Henry T. Olsen and Michael A. Sileo, Jr.

ABSTRACT: An inverter for a metal-insulator-semiconductor integrated circuit which utilizes an MOS inverter stage followed by a bipolar emitter-follower stage is disclosed. The inverter stage may have multiple inputs to form a gate. The emitter-follower stage employs a bipolar transistor with an MOS transistor as the load impedance. The size of the output MOS transistor can be changed to provide optimum drive characteristics without redesigning the remainder of the integrated circuit. The emitter-follower output stage provides a very low output impedance, and therefore has the capability to drive higher capacitive loads.

Figures 1, 2:
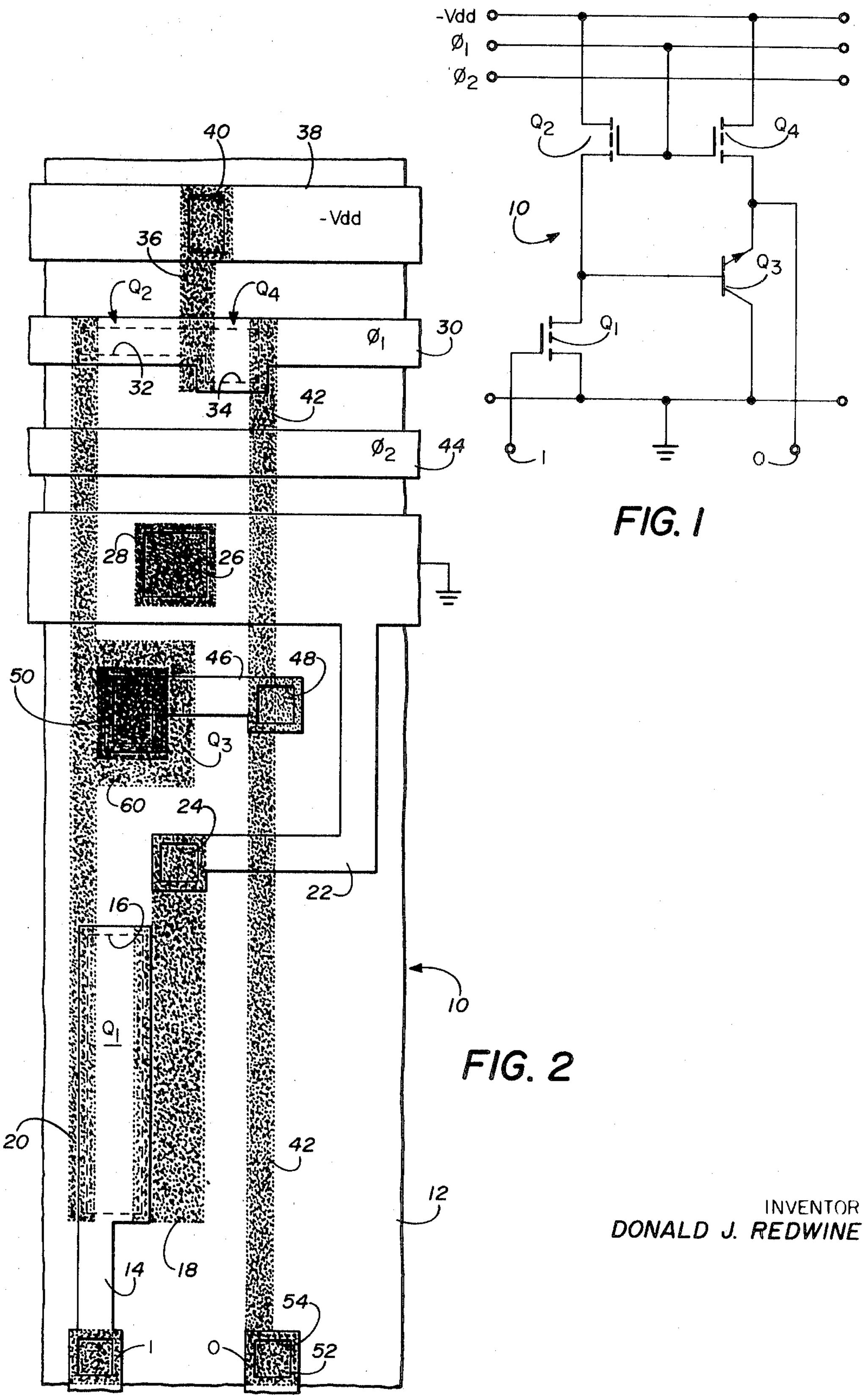

INVENTOR
DONALD J. REDWINE

MOS CIRCUIT WITH BIPOLAR EMITTER-FOLLOWER OUTPUT

This invention relates generally to semiconductor integrated circuits, and more particularly relates to metal-insulator-semiconductor integrated circuits.

The metal-insulator-semiconductor (MOS) transistor wherein the insulator is silicon oxide is currently the most practical form and therefore the most widely used type of field effect transistor. The MOS transistor is typically a high voltage, low current device. These characteristics are due mainly to the values of hole and electron mobilities at the surface of the semiconductor. These characteristics require that the MOS transistors drive high impedance loads in order to develop the voltage levels required in a circuit. These devices have many useful applications in integrated circuit form, commonly referred to as MOSIC's. In the typical situation, one MOSIC will drive one or more other MOSIC's. Thus, the output load, for all practical purposes, is capacitive. In general, the problem of getting the logic signal from one MOSIC to another MOSIC has been the most difficult to overcome in the design of such devices. Internally an MOSIC may be very complex and fast, but this characteristic has heretofore been practically useless because the speed of the circuit was limited by the output buffers.

The output impedance, and therefore the transient time performance, of an all MOS output buffer is controlled by adjusting the width-to-length ratio of the MOS transistors. Conventional output buffers use very large MOS transistors to drive even minimal external capacitances, such as 20 picofarads, at relatively slow speeds, such as 1 MHz. The large output MOS transistors must themselves be driven by large MOS transistors, such that each of the last few stages of a circuit must have progressively larger drive capability. This results in what is commonly referred to as a tapered output. The larger MOS transistors have increased power dissipation, and occupy a large area of the integrated circuit chip.

There are many instances in an MOSIC logic circuit where a signal inversion is required, both within the circuit and at the output. There are also many cases where inverting gate functions are required, such as those performed by NAND and NOR gates. This invention is concerned with a logic inverter, which may have one or more logic inputs to form a gate, having a very low output impedance, and thus a low transient time when driving a highly capacitive load, such as other MOS circuitry either within the same IC or on one or more other IC's. The inverter in accordance with this invention utilizes an output stage comprised of a bipolar transistor and an MOS transistor which form an emitter-follower stage with the MOS transistor acting as the load impedance. The emitter-follower stage is controlled by an MOS inverter stage which may have a plurality of logic inputs to form a gate. The output stage follows the output of the MOS inverter stage. The inverter thus has the very low input capacitance of the inverter stage, yet has the low output impedance necessary to drive a highly capacitive load. The length-to-width ratio of the MOS transistor in the output stage can be changed to achieve optimum performance without affecting the input stage.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

FIG. 1 is a schematic circuit diagram of an inverter in accordance with the present invention; and FIG. 2 is a plan view of a portion of an integrated circuit embodying the inverter in FIG. 1.

Referring now to the drawings, an inverter in accordance with the present invention is indicated generally by the reference numeral 10 in FIG. 1. The inverter 10 is comprised of an inverter stage comprised of MOS transistors $Q_1$ and $Q_2$, followed by an emitter-follower stage comprised of bipolar transistors $Q_3$ and MOS transistors $Q_4$.

The gate of transistor $Q_1$ is the logic input I. The source of transistor $Q_1$ is connected to a source supply voltage, which is typically ground potential. The drain of transistor $Q_1$ and the source of transistor $Q_2$ are common and form the output of the inverter stage which is connected to the base of bipolar transistor $Q_3$. The drain of transistor $Q_2$ is connected to a drain supply voltage $-V_{dd}$, which is typically −6.0 volts. The gate of transistor $Q_2$ is connected to a pulsed clock voltage source $\Phi_1$ which acts merely as a gate supply voltage. The clock voltage could be steady state without affecting the operation of the system. The clock voltage is used because it is conveniently available on the integrated circuit illustrated, and the intermittent use reduces the power dissipated.

The collector of transistor $Q_3$ is connected to the source supply voltage, which as mentioned is ground, and the emitter is common with the source of MOS output transistor $Q_4$ and forms the output 0. The drain of transistor $Q_4$ is connected to the drain supply voltage, and the gate of MOS transistor $Q_4$ is connected to the clock voltage $\Phi_1$, which as mentioned merely serves as a gate supply voltage. A clock line $\Phi_2$ is illustrated but is not utilized in the inverter 10.

As illustrated, the MOS transistors are P-channel devices and the bipolar transistor $Q_3$ is an NPN device. Accordingly, the logic levels at input are approximately −1.0 volt, which represents the logic "0" level, and approximately −6.0 volts, which represents the logic "1" level. The width-to-length ratio of MOS transistor $Q_1$ is typically about 15, while the width-to-length ratio of transistor $Q_2$ is typically only about 0.3. Bipolar transistor $Q_3$ typically has an $h_{fe}$ of about 50. The width-to-length ratio of output MOS transistor $Q_4$ may vary widely depending upon the capacitive load to be driven.

OPERATION

When a logic "0" level of about −1.0 V is applied to logic input I, transistor $Q_1$ is turned "off" so that the base of transistor $Q_3$ approaches the drain supply voltage $-V_{dd}$ during the clock pulse. Since the transistor $Q_3$ is connected in emitter-follower configuration, the output 0 follows the base of transistor $Q_3$ to a negative level approximately equal to the negative voltage at the base plus the base-emitter drop of transistor $Q_3$. The rate at which the output is charged negatively is determined primarily by the size of the capacitive load and the width-to-length ratio of transistor $Q_4$.

When the logic input I goes to a logic "1" level of approximately −6.0 volts, transistor $Q_1$ is turned "on" so that the base of bipolar transistor $Q_3$ approaches the source voltage, which is ground potential. Transistor $Q_3$ then turns "on" and discharges the capacitive load connected to the output 0 until the output voltage is once again equal to the voltage at the base plus the base-emitter offset voltage of transistor $Q_3$, which is the logic "0" level. The rate at which the capacitive load is discharged is determined primarily by the rate at which transistor $Q_1$ switches, which can be very rapid. The current gain and inherent speed of the bipolar transistor $Q_3$ provides the current capacity to rapidly discharge even a relatively large capacitive load.

The inverter 10 may be converted to a multiple input NOR gate merely by connecting additional MOS transistors parallel to transistor $Q_1$ and still have substantially the same output characteristics.

The inverter 10 shown in schematic form in FIG. 1 is embodied in an integrated circuit a portion of which is illustrated in the plan view in FIG. 2. The circuit is typically formed on an N-type silicon substrate 12. The source and drain regions of the MOS transistors and the base region of the bipolar transistor are then formed by P-type diffusions which are indicated by the lightly stippled areas. The P-type diffusion is then followed by an N-type diffusion to form the emitter of the bipolar transistor and an ohmic contact from the ground conductor line to the substrate. An oxide layer is formed over the substrate to provide an insulating layer. Then metal conductor strips are formed on the oxide layer. Openings, represented by depressions in the metal conductor strips, are formed in the oxide layer under the conductor strips where electrical contact is desired with the underlying diffused region, and the oxide layer is thin in the areas represented by dotted outline under the conductive strips where it is desired to form the channel of an MOS transistor.

Thus, conductor strip 14 forms the input I and the gate of transistor $Q_1$ the channel of which is formed by the thin oxide in the dotted outline 16. Diffused regions 18 and 20 form the source and drain regions, respectively, of transistor $Q_1$. Diffused region 20 also forms the base of bipolar transistor $Q_3$ and the source of MOS transistor $Q_2$. Diffused region 18 is connected to ground by a conductor 22 which passes through opening 24 in the oxide layer. Conductor 22 is also in ohmic contact with the N-type substrate through the opening 26 in the oxide layer and through the heavily doped N-type diffused region 28. Conductor 30 carries clock voltage $\Phi_1$ and forms the gates of transistors $Q_2$ and $Q_4$ in the areas 32 and 34, respectively, where the oxide is thin. Diffused region 36 forms the drains of both transistor $Q_2$ and transistor $Q_4$ and is connected to the drain supply voltage by conductor 3 which extends through opening 40 in the oxide. Diffused region 42 forms the source of transistor $Q_4$ and also provides a conductive path tunneling under conductors 44 and 22 to conductor 46, which connects the diffused region 42 to the diffused region 60 which forms the emitter of bipolar transistor $Q_3$. Conductor 46 extends through openings 48 and 50 in the oxide and into contact with the diffused regions 42 and 60, respectively. The diffused region 42 continues under conductor 22 to provide a conductive path to conductor 52 which forms the logic output 0. Conductor 52 is in contact with diffusion 42 through opening 54 in the oxide.

Although the embodiment of the invention described utilized P-channel MOS transistors and NPN bipolar transistors, it is to be understood that the invention is equally applicable to N-channel MOS transistors and PNP bipolar transistors, as well as to other types of field effect devices.

Although a preferred embodiment of the invention has been described in detail, it is to be understood that various changes, substitutions and alterations can be made therein without departing from the spirit and scope of the invention as defined by the appended claims.

What I claim is:

1. In an integrated semiconductor logic circuit, a bipolar transistor and a first metal-insulator-semiconductor transistor connected in series between source and drain voltage supplies to form an emitter-follower output stage, and a logic control circuit connected to drive the base of the bipolar transistor.

2. The logic circuit defined in claim 1 wherein the logic circuit is an inverter stage comprising first and second metal-insulator-semiconductor transistors the channels of which are connected in series between source and drain voltage supplies, the gate of the first MOS transistor being the logic input of the inverter stage and the common drain-source being the logic output and being connected to the base of the bipolar transistor.

3. The logic circuit defined in claim 1 wherein the logic control circuit comprises a metal-insulator-semiconductor inverter stage having at least one logic input.

4. The logic circuit defined in claim 1 wherein the bipolar transistor is an NPN transistor and the metal-insulator-semiconductor transistor is a P-channel transistor.

5. The logic circuit defined in claim 1 wherein the bipolar transistor is a PNP transistor and the metal-insulator-semiconductor transistor is an N-channel transistor.

6. In an integrated MOS logic circuit, first and second MOS transistors the channels of which are connected in series between source and drain voltage supplies, the saturation impedance of the first MOS transistor being substantially smaller than the saturation impedance of the second MOS transistor, the gate of the first MOS transistor being the logic input, a bipolar transistor the collector-emitter circuit of which is connected in series with the channel of a third MOS transistor between the source and drain supply voltage, the base of the bipolar transistor being connected to the drain of the first MOS transistor and the emitter being the logic output, and the gates of the second and third transistors being connected to a gate supply voltage.